(12) United States Patent
vor dem Brocke et al.

(10) Patent No.: US 12,126,347 B2
(45) Date of Patent: Oct. 22, 2024

(54) CONTROL UNIT, RADIO FREQUENCY POWER GENERATOR, AND METHOD FOR GENERATING SYNCHRONIZED RADIO FREQUENCY OUTPUT SIGNALS

(71) Applicant: COMET AG, Flamatt (CH)

(72) Inventors: Manuel vor dem Brocke, Bramsche (DE); Roland Schlierf, Frechen (DE); André Grede, Bern (CH); Daniel Gruner, Badenweiler (DE); Anton Labanc, Ehrenkirchen (DE)

(73) Assignee: COMET AG, Flamatt (CH)

( * ) Notice: Subject to any disclaimer, the term of this patent is extended or adjusted under 35 U.S.C. 154(b) by 8 days.

(21) Appl. No.: 18/018,952

(22) PCT Filed: Aug. 3, 2021

(86) PCT No.: PCT/EP2021/071675
§ 371 (c)(1),
(2) Date: Jan. 31, 2023

(87) PCT Pub. No.: WO2022/029125
PCT Pub. Date: Feb. 10, 2022

(65) Prior Publication Data
US 2023/0283282 A1 Sep. 7, 2023

(30) Foreign Application Priority Data

Aug. 7, 2020 (EP) ..................................... 20190074

(51) Int. Cl.
*H03L 7/08* (2006.01)
*H03K 5/24* (2006.01)

(52) U.S. Cl.
CPC ...... *H03L 7/08* (2013.01); *H03K 5/24* (2013.01)

(58) Field of Classification Search
CPC ....... H03L 7/0994; H03L 7/087; H03L 7/093; H03L 2207/50; H03L 7/099;
(Continued)

(56) References Cited

U.S. PATENT DOCUMENTS

| 7,532,250 B2 | 5/2009 | Sonobe |
| 2002/0003452 A1 | 1/2002 | Mizuno et al. |

(Continued)

FOREIGN PATENT DOCUMENTS

| CN | 202679346 U | 1/2013 |
| CN | 208752198 U | 4/2019 |
| JP | H1041816 A | 2/1998 |

*Primary Examiner* — Lincoln D Donovan
*Assistant Examiner* — Tyler J Pereny
(74) *Attorney, Agent, or Firm* — The Webb Law Firm

(57) ABSTRACT

A control unit for generating a plurality of synchronized radio frequency (RF) output signals ($RF_{out,i}$) each having a respective output frequency ($f_i$), phase ($\Phi_i$), and amplitude ($A_i$), including a signal comparator configured to compare a reference signal having a reference frequency ($f_{ref}$) and a reference phase ($\Phi_{ref}$) with a feedback signal having a feedback frequency ($f_{PLL}$) and a feedback phase ($\Phi_{PLL}$), and configured to generate an error signal representative of a difference between the reference signal and the feedback signal; and a data processing unit receiving as an input signal the error signal generated by the signal comparator, and outputting a plurality of waveform tuning signals ($FTW_{PLL}$, $FTW_i$) as a function of the error signal;

wherein a plurality of waveform generators ($DDS_{PLL}$, $DDS_i$) each receiving at least one of the plurality of waveform tuning signals ($FTW_{PLL}$, $FTW_i$) output by the data processing unit, wherein each waveform generator ($DDS_{PLL}$, $DDS_i$) generates a time-dependent amplitude signal ($A_{PLL}(t)$, $A_i(t)$) as a function of the received respective waveform tuning signal ($FTW_{PLL}$, $FTW_i$), wherein one predetermined amplitude signal ($A_{PLL}(t)$) of the generated plurality of amplitude signals ($A_{PLL}(t)$, $A_i(t)$) represents the feedback signal input to the signal comparator, and the other amplitude signals ($A_i(t)$) represent the respective radio frequency (RF) output signals ($RF_{out,i}$) to be generated, and wherein the data processing unit is configured to adjust both the waveform tuning signal ($FTW_{PLL}$) corresponding to the one predetermined amplitude signal ($A_{PLL}(t)$) representing the feedback signal such as to (Continued)

minimize the error signal, and the other waveform tuning signals ($FTW_i$) corresponding to the other amplitude signals ($A_i(t)$) representing the radio frequency (RF) output signals ($RF_{out,i}$) based on the adjusted waveform tuning signal ($FTW_{PLL}$) of the predetermined amplitude signal ($A_{PLL}(t)$) representing the feedback signal.

The disclosure further describes a radio frequency (RF) power generator, an arrangement of at least two such radio frequency (RF) power generators, and a method each for generating a plurality of synchronized radio frequency (RF) output signals ($RF_{out,i}$).

24 Claims, 9 Drawing Sheets

(58) Field of Classification Search
CPC ....... H03L 7/0991; H03L 7/0992; H03L 7/23; H03L 7/16; H03L 7/189; H03L 2207/06; H03L 7/07; H03L 7/08; H03L 7/0891; H03L 7/091; H03L 7/095; H03L 7/14; H03L 7/18; H03L 7/185; H03L 7/235; H04L 7/0331; H04L 27/0014; H04L 27/2637; H04L 27/2657; H04L 7/0087; H04L 7/04

See application file for complete search history.

(56) References Cited

U.S. PATENT DOCUMENTS

| | | |
|---|---|---|
| 2002/0070811 A1 | 6/2002 | Skierszkan |
| 2005/0162197 A1* | 7/2005 | Koyama ................... H03L 7/23 327/105 |
| 2010/0164561 A1 | 7/2010 | Roberg et al. |
| 2010/0171648 A1 | 7/2010 | Himmelstoss et al. |
| 2013/0170512 A1* | 7/2013 | Schmelzer ............ H03L 7/0991 372/29.012 |
| 2014/0139293 A1 | 5/2014 | Tsangaropoulos et al. |
| 2015/0116016 A1* | 4/2015 | Salleh ................... H03L 7/0891 327/157 |
| 2016/0352506 A1 | 12/2016 | Huang |
| 2020/0412372 A1* | 12/2020 | vor dem Brocke ... H03L 7/0994 |

\* cited by examiner

CONTROL UNIT, RADIO FREQUENCY POWER GENERATOR, AND METHOD FOR GENERATING SYNCHRONIZED RADIO FREQUENCY OUTPUT SIGNALS

CROSS-REFERENCE TO RELATED APPLICATIONS

This application is the United States national phase of International Application No. PCT/EP2021/071675 filed Aug. 3, 2021, and claims priority to European Patent Application No. 20190074.3 filed Aug. 7, 2020, the disclosures of which are hereby incorporated by reference in their entirety.

BACKGROUND OF THE DISCLOSURE

Field of the Disclosure

The disclosure relates in general to generating a plurality of synchronized radio frequency (RF) signals each having a respective output frequency, phase, and amplitude, e.g. for driving a plasma processing system. In particular, the disclosure relates to a control unit, a radio frequency power generator, and a method for generating a plurality of synchronized radio frequency signals each having a respective output frequency, phase, and amplitude. Furthermore, the disclosure relates to an arrangement of at least two such radio frequency power generators.

Description of Related Art

The basic principle of generating arbitrary analog waveforms by digital means, e.g. so-called waveform generators, from a fixed-frequency system clock by using digital frequency tuning information which sets the required output frequencies is generally known in the art. A digital-to-analog converter followed by a reconstruction filter then transforms the resulting digital sequence into the intended analog waveform.

For example, US 2010/0164561 A1 describes an example for generating radio frequency signals.

US 2013/0170512 A1 describes multiple phase-locked loops for high-power RF-power combiners, wherein by means of each respective phase-locked loop one respective radio frequency output signal is generated, meaning that for each individual RF output signal one phase-locked loop is required. Scalability is therefore rather limited, or requires at least high efforts with respect to high design and manufacturing complexity, high operational complexity to keep the individual RF output signals synchronized within required tolerances for example (cf. noise or thermal drift), high number of electronic components, high cost, and the like.

Accordingly, there is a need for a control unit, a radio frequency power generator, and a method each for generating a plurality of synchronized radio frequency signals being distinguished by an improved performance, where performance is assessed, inter alia, on the qualities of scalability, operational robustness, frequency precision, application flexibility, manufacturing ease and cost.

SUMMARY OF THE DISCLOSURE

It is an object of the present disclosure to provide a control unit, a radio frequency power generator, and a method each for generating a plurality of synchronized radio frequency signals as well as an arrangement of such radio frequency power generators which each ensure high system scalability, high operational robustness, e.g. low susceptibility to interference due to noise, temperature and the like, high signal precision with respect to frequency, phase, and amplitude for example, high flexibility with respect to various use cases, as well as low design and manufacturing complexity and cost.

The disclosure and advantageous embodiments of the disclosure are defined herein.

According to an aspect, a control unit, e.g. as part of a radio frequency (for short, also referred to as RF herein) power generator, for generating a plurality of synchronized RF output signals each having a respective output frequency, phase, and amplitude comprises:
  a signal comparator configured to compare a reference signal having a reference frequency and a reference phase with a feedback signal having a feedback frequency and a feedback phase, and the signal comparator being configured to generate an error signal representative of a difference between the reference signal and the feedback signal; and
  a data processing unit, e.g. an electronic data processing unit such as a microprocessor, microcontroller, digital signal processor and the like, receiving as an input signal the error signal generated by the signal comparator, and outputting a plurality of waveform tuning signals as a function of the error signal; further comprising:
  a plurality of waveform generators each receiving at least one of the plurality of waveform tuning signals output by the data processing unit, wherein each waveform generator generates a time-dependent amplitude signal as a function of the received respective waveform tuning signal;
  wherein one predetermined amplitude signal of the generated plurality of amplitude signals represents the feedback signal input to the signal comparator, and the other amplitude signals represent the respective RF output signals to be generated; and
  wherein the data processing unit is configured to adjust both the waveform tuning signal corresponding to the one predetermined amplitude signal representing the feedback signal such as to minimize the error signal, and the other waveform tuning signals corresponding to the other amplitude signals representing the RF output signals based on the adjusted waveform tuning signal of the predetermined amplitude signal representing the feedback signal.

In the sense of the disclosure the term "signal" denotes a function that conveys information about a phenomenon, e.g. a varying voltage or current. The signal may comprise an analog or a digital signal unless otherwise actually specified.

Further, it is noted that the error signal is minimal or may be zero when the feedback signal (almost) equals the reference signal, e.g. with respect to their respective phases and/or frequencies. The bigger the difference between the reference signal and the feedback signal, the greater the amount of the error signal.

In the afore-mentioned sense, the term "waveform tuning signal" denotes information, be it represented either analogously or digitally, characterizing the time-dependent amplitude signal, again either as an analogously or digitally represented information (e.g. a digital bitstream representing discrete amplitude values of the RF output signal to be generated by the control unit). Thus, the waveform generator generates the time-dependent amplitude signal as a function of the respective waveform tuning signal input thereto.

Further, according to the disclosure, one of the plurality of time-dependent amplitude signals is associated with the feedback signal, whereas the other amplitude signals are respectively associated with one of the plurality of RF output signals to be generated by the control unit.

The arrangement of the data processing unit being configured to adjust the waveform tuning signal corresponding to the one predetermined amplitude signal representing the feedback signal such as to minimize the error signal output by the signal comparator, and the signal comparator which receives the reference signal and the feedback signal as input signals constitutes a control loop, e.g. a phase-locked loop (herein also referred to as PLL for short).

Thus, by adjusting the other waveform tuning signals corresponding to the other amplitude signals representing the RF output signals to be generated based on the adjusted waveform tuning signal of the predetermined amplitude signal representing the feedback signal, the control unit according to the disclosure facilitates the generation of a multitude of RF output signals mutually synchronized and also synchronized to the reference signal (through the feedback signal) by using only one single control loop.

Particularly, all output RF signals are frequency locked to the reference signal, and—in case they have the same frequency as the reference signal (i.e. feedback signal)—they are even phase-locked.

Apart from the feedback signal, which is exclusively used as the control loop (e.g. PLL) signal, all other analog RF output signals can be employed for various application specific purposes. For example, the analog RF output signals may be used to drive multi-stage power amplifier circuits to produce medium- or high-frequency power signals. In addition, some output signals may be used to serve as reference signals for further synchronized signal sources, e.g. additional medium- or high-frequency power supplies. In contrast to the feedback signal which has the same frequency and phase as the reference signal, all other output signals can have arbitrary frequencies and phase differences, as required for the specific application.

The generated RF output signals possibly having several different frequencies and/or phases and/or amplitudes with respect to each other may be routed into respective power amplifiers. The resulting power RF output signals may then be used to supply a plasma processing system for semiconductor wafers with RF power of multiple frequencies, for example. Using RF power of multiple frequencies in plasma processes advantageously allows to adjust multiple parameters to better control, among others, ion density, electron density, and plasma uniformity over a large area: this ultimately results in quality improvement of the semiconductor being processed because various key process parameters can be adjusted more independently compared to a single-frequency powered process.

The RF output signals may be used also as so-called common exciter (CEX) signals to synchronize additional power generators. In consequence, the RF signals generated by different power supplies are frequency-locked which can be advantageous in complex plasma processes.

In addition, RF output signals to be used as CEX signals for further power generators may be generated to have a specific phase difference to other RF output signals of the same frequency. The phase difference can either be implemented already in the CEX signal from the first power generator, or it can be added by a (e.g. digital) waveform generator in the other power generator(s).

Thus, even chains of multiple RF power generators, each using the control unit according to the disclosure, may be set up with different phase shifts for plasma systems which process large area substrates where RF power is fed into multiple input ports. The phase differences between the individual input ports may be adjusted such as to produce a most homogeneous process result over the entire substrate surface.

The control unit according to the disclosure is scalable to any number of RF output signals (also referred to as channels herein) which are all synchronized to the same reference signal and/or phase locked (depending on if the RF output signal of a channel has the same frequency as the frequency of the reference signal, is a multiple of the reference frequency, or has a constant phase offset to the reference frequency). For this, only one single (PLL) control loop is needed.

Consequently, for a multitude of RF output signals, instead of having to use multiple control loops (PLLs) one for each of the RF output signals, only one single control loop is required according to the disclosure.

The reference loop (control loop) and an arbitrary number of RF output channels/signals are fully synchronized (time base sync/phase lock), however, still their signals are fully decoupled.

Moreover, as soon as the reference/control loop (PLL) is locked, any newly generated RF output signal on any channel with any frequency or output amplitude is immediately locked. There is absolutely no (zero) settling time or transitory effects. The same holds true for any intentional changes of frequency or phase of any of the RF output signals. Due to the disclosed concept herein no other feedback/control loop is needed.

Additionally, in spite of using non-precision internal system clocks (i.e. cost advantage) for driving the control unit for example, offsets and variations of these non-precision clocks (e.g. thermal drifts) are automatically compensated because all waveform tuning signals are determined from the waveform tuning signal corresponding to the feedback signal. Variations of the system clock will automatically cause the waveform tuning signals corresponding to the RF output signals to be adjusted such that they are always locked to the feedback signal and the reference signal, respectively.

Often, in conventional PLL signal generators, the reference frequency and the output frequency of a PLL signal generator are different (e.g. 1 MHz as reference, and 10 MHz as output frequency). In such cases, the output signal cannot be used directly as a feedback signal for the comparator circuit, e.g. a phase-frequency discriminator (PFD). Instead, the feedback signal has to be transformed into a signal of the same frequency as the reference by means of a divider circuit (e.g. with a 1:10 ratio). Such a divider is required with conventional solutions such as shown, for example, in the afore-mentioned patent application publication US 2013/0170512 A1.

With the present disclosure, there is no need for a divider, since always a feedback signal with the same frequency as the reference is generated. The other RF output signals which will be used for the application can have any frequency and/or phase-shift, independent from the reference signal. Nevertheless, they are synchronized with the (PLL) reference signal via the feedback signal.

Still further, the use of one single specific output signal as the feedback signal for the (PLL) control loop allows to simplify also pulsing operations. Those RF output signals which shall be pulsed can be modulated directly via the respective waveform generator by setting the corresponding time-dependent amplitude signal to zero, while the feedback signal is left unchanged without switching it off. Therefore, the synchronization is maintained at all times independent of the pulse pattern. For a traditional PLL with one output signal from which a part is branched off as a feedback signal, the pulsing has to be achieved by modulating the amplitude after branching the control signal for the PLL loop, e.g. by means of a switch. If the signal were already pulsed at the source, the feedback signal would be modulated as well, and this would cause loss of synchronization after every pulse.

Also, in a conventional PLL setup, for generating an output signal which has an increasing or decreasing amplitude, i.e. the amplitude is ramped up or down between two levels, the feedback signal for the PLL which is branched off the main output signal would vary in amplitude as well. This would affect the accuracy of the PLL loop by amplitude/phase noise for low amplitudes. With the herein disclosed disclosure, the feedback signal has always the same amplitude without variation, i.e. being independent from amplitude modulations of the RF output signals.

Since there is zero settling time for changes to frequency and/or phase of the RF output signals, this also means that changes in frequency or phase of different output channels/signals can be timed against each other. For example, it is possible to use two channels A and B where channel A has frequency $f_A$ and channel B has frequency $f_B$. They are both synchronized to the same reference frequency (or common exciter frequency CEX) because of the locked feedback signal channel which is part of the control loop (PLL). Both channels, i.e. channel A and channel B, can have an offset which is $\Delta f = f_A - f_B$. If the frequency of channel A is ramped up or changed in a step, the frequency of channel B can always be kept at the same offset $\Delta f$ by keeping the respective waveform tuning signals at a constant offset.

In the case that several RF generators are combined each using a control unit according to the disclosure, a master generator may provide CEX signals for the connected slave generator(s), or a chain of generators is formed in which each generator may provide a CEX signal for the next generator in the sequence. The length of the CEX signal cable adds an intrinsic phase shift to the CEX signal which is received by the slave generator. With the disclosure, phase shifts due to cable length can easily be compensated on either the sending or the receiving generator by adding an appropriate compensating phase shift to the respective RF output signal. Configurations with identical or individual intentional phase shifts between the CEX input signals of a multitude of generators and a master generator can be realized with the disclosure.

From the above it is clear that the control unit according to the disclosure ensures high system scalability, high operational robustness, in particular low susceptibility to interference due to noise, temperature and the like, high signal precision/synchronization with respect to frequency and phase, a high degree of freedom with respect to a multitude of different application scenarios, and also facilitates comparatively low design and manufacturing complexity and cost.

According to other embodiments of the disclosure, the signal comparator is configured to compare at least one of a phase difference and a frequency difference of the reference signal and the feedback signal, wherein the error signal is representative of at least one of said phase difference and frequency difference. For example, using a PLL as a control loop requires the evaluation of the phase difference between the signals to be compared. However, according to other advantageous embodiments, it may suffice to compare the frequencies of the signals to be compared, for example by means of a counter device, thus an evaluation of the phase difference between the reference and the feedback signals may be omitted.

According to further embodiments, the signal comparator is at least one of a phase discriminator (PD), phase-frequency discriminator (PFD), a frequency mixer, and a counter.

Still further according to advantageous embodiments of the disclosure, the reference signal comprises one of a precision crystal oscillator signal, an oven-controlled crystal oscillator (OCXO) signal, an atomic clock signal, a high-precision oscillator signal synchronized with an atomic clock, and a common exciter (CEX) signal generated by an RF generator, e.g. an RF generator according to another aspect of the disclosure as described further below.

Yet according to other advantageous embodiments, the control unit further comprises a reference signal source configured to generate the reference signal, e.g. the reference signals as set forth above, i.e. a precision crystal oscillator, an oven-controlled crystal oscillator (OCXO), a high-precision oscillator synchronized with an atomic clock.

According to further embodiments of the disclosure, the control unit comprises a series connection of a loop filter and an analog-to-digital-converter (ADC) configured and arranged such as to generate a digital representation of the error signal from the signal comparator. The digital representation of the error signal is fed to the data processing unit. The data processing unit according to such embodiments is a digital data processing unit outputting a plurality of digital waveform tuning words as the waveform tuning signals as an input for the plurality of waveform generators. The digital data processing unit may be, without limitation, a microprocessor, microcontroller, digital signal processor, and the like. The waveform tuning words are digital representations of the respective waveform tuning signals.

It is to be noted that the waveform tuning words may be structured as a group of several digital bits, e.g. 8, 12, 16, 32, 64, and the like, however, without being limited to the afore-listed values. In this digital representation of the waveform tuning information the waveform tuning word may comprise bits for frequency information, bits for phase information, and/or bits for amplitude information (e.g. an amplitude multiplication factor).

Thus, according to further embodiments of the disclosure, the waveform tuning word comprises at least one of a frequency information, a phase information, and an amplitude information for generating the time-dependent amplitude signal.

Yet further according to embodiments of the disclosure, each of the waveform generators comprises a direct digital synthesis (DDS) core generating a digital bitstream representative of digital amplitude values constituting the respective time-dependent amplitude signal.

According to still further embodiments of the disclosure, the control unit comprises at least one digital-to-analog-converter (DAC) converting the digital amplitude values contained in the bitstreams generated by the waveform generators into the feedback signal and the RF output signals, respectively.

Yet according to other embodiments of the disclosure, the digital-to-analog-converter (DAC) is one of a multi-channel digital-to-analog-converter, a plurality of single-channel digital-to-analog-converters, a plurality of dual-channel digital-to-analog-converters or a combination thereof. For example, the DAC converting all the digital amplitude values into both the feedback signal and the RF output signals may be embodied by a combination of several dual-channel DACs, thus reducing the overall number of required DACs by the factor of two compared to using only single-channel DACs. However, also one multi-channel DAC may be used comprising at least as many conversion channels as are necessary to convert the feedback signal and all the RF output signals to be generated.

According to other embodiments, the control unit comprises at least one signal reconstruction filter filtering at least one of the RF output signals after conversion by the DAC. The reconstruction filter may be a low-pass or a band-pass filter, for example, which removes unwanted frequency components and noise. For the converted feedback signal, such a reconstruction filter may be omitted depending on the specific design of the signal comparator circuit.

According to further embodiments of the disclosure, the control unit comprises a feedback signal reconstruction filter filtering the feedback signal after conversion by the DAC. Also, the reconstruction filter may be a low-pass or a band-pass filter, for example, which removes unwanted frequency components and noise.

According to other advantageous embodiments, at least one of the data processing unit and the plurality of waveform generators is/are formed by at least one of a field programmable gate array (FPGA), a System-on-Chip (SoC), and an application-specific integrated circuit (ASIC).

Yet further according to other advantageous embodiments, the control unit comprises a system clock generating a system clock signal, wherein the plurality of waveform generators and the digital-to-analog converter (DAC) are driven by the system clock signal. Preferably, the system clock may be a non-precision system clock (cost advantage). However, any temporal variations of the (non-precision) system clock frequency and its derived clock signals are automatically compensated since all waveform tuning signals/words corresponding to the RF output signals are calculated from the waveform tuning signal/word corresponding to the feedback signal which is locked to the reference signal/frequency.

Overall, all RF output signals as well as the (PLL) feedback signal share the same time base due to the common system clock and its derived clock signals. By means of the (PLL) control loop and the feedback signal, the RF output signals are at the same time also locked to the (PLL) reference signal. All RF output signals are frequency locked to the reference signal, and—in case they have the same frequency as the reference signal—they are even phase-locked.

According to further advantageous embodiments of the disclosure, a waveform generator clock signal for driving the waveform generators and a DAC clock signal for driving the DAC are different predetermined rational fractions of the system clock signal of the system clock. In other words, different driving clock signals are derived from the common system clock signal for the waveform generators and the DAC(s), respectively.

Typically, the system clock signal and all derived clock signals, e.g. waveform generator clock signals and/or data processing clock signal (e.g. an FPGA clock signal if the waveform generator and/or the data processing unit is/are formed by an FPGA as mentioned above) and DAC clock signals, are not precision clock signals. Their values might slightly deviate from the specified (nominal) value, and in addition, their values might vary over time depending on environmental factors, e.g. thermal effects.

For the purpose of convenience, the short term FPGA clock (signal) is used in the description below to denote a clock (signal) driving at least the waveform generators, and optionally also the data processing unit. It is to be emphasized, however, that the term FPGA clock (signal) is not to be meant being limited to only FPGA embodiments of the waveform generators and/or the data processing unit. Rather, the term FPGA clock (signal) shall comprise embodiments where the waveform generators and/or the data processing unit are embodied by a System-on-Chip (SoC) or an application-specific integrated circuit (ASIC) or other circuit means known in the art suitable to embody the waveform generators and/or the data processing unit according to the disclosure.

With the above clarification, the FPGA clock frequency is typically a rational number multiple $m_1/n_1$ of the system clock frequency, e.g. 33.3 MHz for a 100 MHz system clock frequency (wherein $m_1$ and $n_1$ are integer numbers).

In the same way, the DAC clock frequency is derived from the system clock and is typically a rational number multiple $m_2/n_2$ of the system clock, e.g. system clock frequency 100 MHz, DAC clock frequency 1 GHz (wherein $m_2$ and $n_2$ are integer numbers).

The described disclosure allows to synchronize the internal clocks of the control unit with the precision reference frequency, e.g. an internal precision oscillator or an externally provided precision CEX signal.

In the (PLL) control loop, the waveform tuning signal/word corresponding to the feedback signal which is required to exactly match the reference signal/frequency is adjusted by means of the error signal output by the signal comparator until the deviation between the reference signal/frequency and the feedback signal/frequency is minimized, e.g. equals zero.

With the adjusted (optimized) waveform tuning signal/word of the feedback signal, the exact values of the various clock frequencies can be calculated according to the following formulae (assuming that each waveform generator comprises a direct digital synthesis (DDS) core):

FPGA Clock:

$$f_{FPGAclock} = \frac{2^N}{FTW_{PLL}} \cdot f_{PLL}$$

where N is the number of bits of a DDS phase accumulator, $f_{PLL}$ is the frequency of the (PLL) feedback signal, and $FTW_{PLL}$ is a waveform tuning word corresponding to the (PLL) feedback signal.

System Clock:

$$f_{sysclock} = n_1/m_1 \cdot f_{FPGAclock} = n_1/m_1 \cdot \frac{2^N}{FTW_{PLL}} \cdot f_{PLL}$$

where $m_1/n_1$ is the rational factor between the system clock and the FPGA clock.

DAC Clock:

$$f_{DACclock} = m_2/n_2 \cdot f_{sysclock} = n_1/m_1 \cdot m_2/n_2 \cdot \frac{2^N}{FTW_{PLL}} \cdot f_{PLL}$$

where $m_2/n_2$ is the rational factor between the system clock and the FPGA clock.

All further frequencies $f_i$ which the various waveform generators (in the assumed case the various DDS cores) have to produce to eventually generate the plurality of RF output signals, e.g. to provide a power generator with predetermined application characteristics, are produced by setting the waveform tuning signals/words $FTW_i$ for the individual DDS cores according to the following formula:

$$FTW_i = \frac{f_i}{f_{FPGAclock}} \cdot 2^N = FTW_{PLL} \cdot \frac{f_i}{f_{PLL}}$$

In this way, all RF output frequencies are automatically synchronized to the (PLL) feedback signal/frequency and the reference signal/frequency. If one of the internal clocks should vary or drift in time, e.g. due to noise or thermal effects, the waveform tuning signal/word $FTW_{PLL}$ for the (PLL) feedback signal/frequency is continuously adjusted such that the difference between the feedback signal/frequency and the reference signal/frequency which is represented by the error signal of the comparator is always minimized.

In addition, since the waveform tuning signals/words $FTW_i$ corresponding to all other RF output signals are calculated from $FTW_{PLL}$, they continuously follow any changes of $FTW_{PLL}$.

In consequence, with the described control mechanism according to the disclosure, all output frequencies are kept constantly at their intended values. The accuracy of the individual frequency values is determined by the precision of the reference signal and the minimized difference between reference signal and (PLL) feedback signal.

For example, in a system without the precision reference and (PLL) control loop according to the disclosure, a presumed FPGA clock frequency of 200 MHz, which in reality is 202 MHz, would cause all other frequencies to be 1% higher than their intended value, e.g. instead of an appropriate ISM frequency (ISM: Industrial, Scientific and Medical Band) of 13.56 MHz, the output signal of a generator would be 13.70 MHz. In case of a thermal drift, the output frequency would more and more drift away from the intended value.

In contrast, with the reference and (PLL) control loop according to the disclosure, systematic discrepancies and all temporal variations of the FPGA clock frequency are always automatically compensated.

According to still other embodiments of the disclosure, the control unit further comprises a memory device, e.g. RAM, EPROM, Flash, ROM, and the like, storing a plurality of predeterminable waveform set values each corresponding to a respective one of the waveform tuning signals of the RF output signals to be generated. In this case, the data processing unit is further configured to output the plurality of waveform tuning signals as a function of the waveform set values.

Like the waveform tuning signals and the waveform tuning words, respectively, as described above, the waveform set values may comprise at least one of a frequency information, a phase information, and an amplitude information corresponding to the respective frequency information, phase information, or amplitude information represented by the waveform tuning signal and waveform tuning word, respectively.

Still according to other advantageous embodiments of the disclosure, the control unit comprises a control device configured to modify the waveform set values stored in the memory device according to a predefined schedule, e.g. an application-specific processing recipe. Thus, a highly dynamic and time-variable processing scheme may be accomplished using the control unit according to the disclosure (e.g. pulsing operations).

According to another aspect of the disclosure, a radio frequency (RF) power generator for generating a plurality of synchronized radio frequency (RF) output signals each having a respective output frequency, phase, and amplitude, comprises: a DC power supply; at least one power amplifier receiving power from the DC power supply, and configured to amplify at least one of the plurality of RF output signals; and a control unit for generating the plurality of RF output signals, wherein the control unit is configured according to any of the embodiments disclosed herein according to the disclosure.

It is to be emphasized that with regard to the effects and advantages of the features regarding the RF power generator according to the disclosure, also reference is made to the full extent to corresponding features of the control unit according to the disclosure as described herein. Therefore, if technical meaningful and applicable, features of the control unit according to the disclosure shall be regarded also as disclosed features for embodiments of the RF power generator according to the disclosure unless explicitly stated otherwise. Likewise, features of the RF power generator according to the disclosure shall be regarded also as features applicable to embodiments of the control unit according to the disclosure unless explicitly stated otherwise. Hence, for the purpose of conciseness and ease of readability duplicate detailed explanations of analogous features are largely omitted or at least reduced to a minimum hereinafter without any such omissions to be construed as limitations.

It is to be understood that not all RF output signals of the RF power generator according to the disclosure are necessarily amplified. Particularly, the amplification by the power amplifier is only required for RF power output signals, however, not for common exciter (CEX) signals which may be output and used to synchronize further RF power generators, for example, as will be described in more detail further below.

According to advantageous embodiments of the disclosure, the RF power generator comprises a common exciter input connected to the control unit for receiving an external common exciter (CEX) signal as the reference signal. In other words, a high precision reference signal may be generated external of the RF power generator according to the disclosure by means of another RF power generator. The other RF power generator can be an RF power generator according to the disclosure without being limited thereto. An arrangement including other RF power generators being fed the CEX output signal generated by the RF power generator according to the disclosure as a reference input signal is also conceivable.

According to still other embodiments of the disclosure, the RF power generator comprises at least one common exciter (CEX) output providing a respective one of the plurality of RF output signals as an external CEX signal. As already mentioned above, preferable, such output CEX signal may not be amplified by a power amplifier amplifying other RF output signals which may be used as RF power output signals to drive a plasma process, for example. However, it may be advantageous to apply at least a (small) preamplification to the CEX output signal before outputting it. The CEX output signal may be used to synchronize further RF power generators as described herein.

Still other advantageous embodiments of the disclosure provide that the RF power generator comprises a user interface device (input/output device), e.g. a display, keyboard, touch screen and the like, for at least one of setting the output frequencies, phases, and amplitudes of the RF output signals to be generated as well as monitoring an operational state of the RF power generator. By means of the user interface setting of temporal sequences of respective output frequencies, phase shifts and amplitudes will become feasible. For example, periodic modulation of the amplitude of the RF output signals may be used for pulsing applications as described herein.

The user interface may also be configured to receive sequences of commands for setting output frequencies, phases, and amplitudes in a temporal sequence from an external computer.

According to still another aspect of the disclosure, an arrangement of at least two radio frequency (RF) power generators each for generating a plurality of synchronized radio frequency (RF) output signals each having a respective output frequency, phase, and amplitude, provides that one of the RF power generators is configured according to the afore-mentioned embodiment comprising the common exciter (CEX) output, and at least one other of the RF power generators is configured according to the afore-mentioned embodiment comprising the common exciter (CEX) input; wherein the RF power generators are interconnected such that the common exciter output of the one of the RF power generators is connected to the common exciter input of the at least one other of the RF power generators.

The CEX signal output via the CEX output of the one RF power generator is used as a precision reference signal to synchronize the other RF power generator(s). As with the RF power output signals, also the CEX output signal may have a different frequency and/or phase than the reference signal input to the RF power generator generating the CEX output signal. Furthermore, preferably, the CEX output signal is not power amplified by a power amplifier as already described above. However, a small preamplification by a preamplifier may be advantageously applied to the CEX output signal before outputting it via the CEX output.

Thus, the CEX output signals differ from the RF power output signals of the RF power generator in that they are not used as a user signal (e.g. to excite a plasma in a plasma process) but rather as a control/reference signal for synchronizing subsequent RF power generators.

Yet according to another aspect of the disclosure, a method for generating a plurality of synchronized radio frequency (RF) output signals each having a respective output frequency, phase, and amplitude, comprises the steps of: (i) comparing a reference signal having a reference frequency and a reference phase with a feedback signal having a feedback frequency and a feedback phase; (ii) generating an error signal representative of a difference between the reference signal and the feedback signal; (iii) generating a plurality of waveform tuning signals as a function of the error signal; (iv) generating a plurality of time-dependent amplitude signals each one as a function of a respective one of the plurality of waveform tuning signals; (v) selecting one predetermined amplitude signal of the generated plurality of amplitude signals as a representation of the feedback signal in step (i); and (vi) outputting the other amplitude signals as the respective RF output signals to be generated; wherein in step (iii) the one waveform tuning signal corresponding to the one predetermined amplitude signal representing the feedback signal is adjusted such as to minimize the error signal in step (ii), and the other waveform tuning signals corresponding to the other amplitude signals representing the RF output signals are adjusted based on the adjusted waveform tuning signal of the predetermined amplitude signal representing the feedback signal.

Again, it is to be emphasized that with regard to the effects and advantages of the features regarding the RF output signal generation method according to the disclosure, also reference is made to the full extent to corresponding features of the control unit and/or RF power generator according to the disclosure as described herein. Therefore, if technical meaningful and applicable, features of the control unit and/or RF power generator according to the disclosure shall be regarded also as disclosed features for embodiments of the RF output signal generation method according to the disclosure unless explicitly stated otherwise. Likewise, features of the RF output signal generation method according to the disclosure shall be regarded also as features applicable to embodiments of the control unit and/or RF power generator according to the disclosure unless explicitly stated otherwise. Hence, for the purpose of conciseness and ease of readability duplicate detailed explanations of analogous features are largely omitted or at least reduced to a minimum hereinafter without any such omissions to be construed as limitations.

According to advantageous embodiments of the disclosure, the method further comprises the steps of: (vii) setting at least one of a frequency, phase, and amplitude as predeterminable signal parameters for at least one of the plurality of RF output signals; (viii) repeating steps (i) to (vi) above for a predetermined time interval; and (ix) repeating steps (vii) and (viii) a predefined number of times. Thus, quite complex and dynamic, i.e. time-variable, application processes may be implemented to be carried out automatically not requiring a user intervention.

It is to be understood that further preferred embodiments of the disclosure can also be any combination of features defined in the dependent claims with the features of the respective independent claim.

Furthermore, it is to be understood that the conjunction " . . . and/or . . . " or the expressions "at least one of . . . " or "one or more of . . . ", if used herein in order to combine a first and a second feature for example, are to be construed as disclosing a first embodiment of the present disclosure that may comprise only the first feature, a second embodiment of the present disclosure that may comprise only the second feature, and a third embodiment of the present disclosure that may comprise both the first and second features. If more than two features are listed, also any combinations thereof are to be construed as disclosed embodiments according to the present disclosure.

Further advantageous embodiments are defined below.

BRIEF DESCRIPTION OF THE DRAWINGS

These and other aspects of the disclosure will be apparent from and elucidated with reference to the embodiments described hereinafter.

The disclosure will now be described, by way of example, based on embodiments with reference to the accompanying drawings.

In the drawings, schematically:

FIG. 1 illustrates a functional diagram of an exemplary embodiment of an RF power generator according to the disclosure comprising an exemplary embodiment of a control unit according to the disclosure.

FIG. 2 illustrates a functional diagram of another exemplary embodiment of an RF power generator according to the disclosure comprising another exemplary embodiment of a control unit according to the disclosure.

FIG. 3 illustrates a functional diagram of yet another exemplary embodiment of an RF power generator according to the disclosure comprising a more detailed functional diagram of the control unit in FIG. 2.

FIG. 4 shows a functional diagram of an exemplary embodiment of an arrangement of two RF power generators according to the disclosure.

FIG. 5 depicts a functional diagram of another exemplary embodiment of an arrangement of two RF power generators according to the disclosure.

FIG. 6 shows a functional diagram of still another exemplary embodiment of an arrangement of two RF power generators according to the disclosure.

FIG. 7 illustrates a functional diagram of an exemplary embodiment of an arrangement of three RF power generators according to the disclosure.

FIG. 8 shows a functional diagram of another exemplary embodiment of an arrangement of three RF power generators according to the disclosure.

FIG. 9 shows a flow chart of an exemplary embodiment of a method for generating RF output signals according to the disclosure.

In the Figures, like numbers refer to like objects throughout. Objects in the Figures are not necessarily drawn to scale.

DESCRIPTION OF THE DISCLOSURE

Various embodiments of the disclosure will now be described by means of the Figures.

Figure 1:
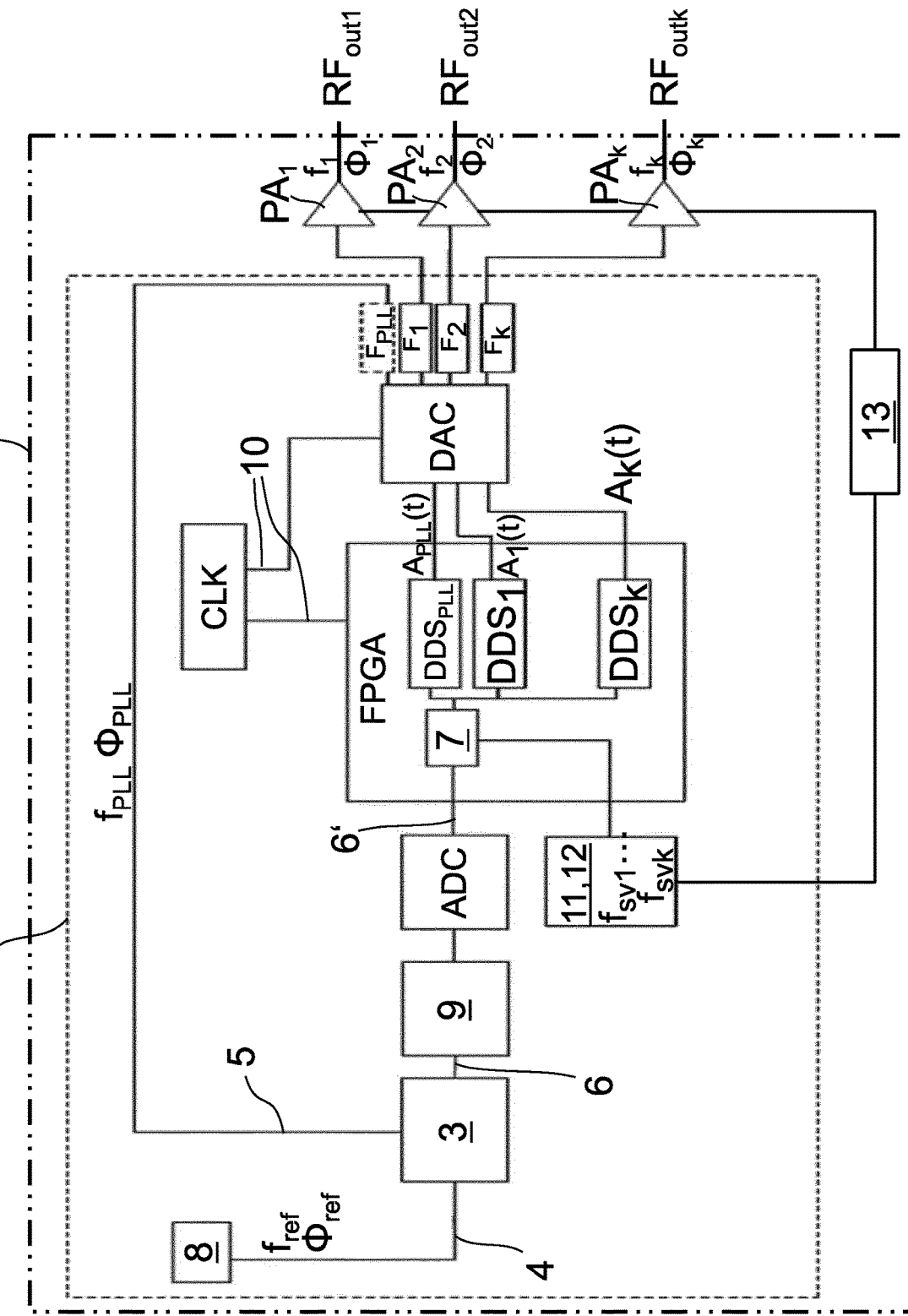

FIG. 1 illustrates a functional diagram of an exemplary embodiment of an RF power generator 1 according to the disclosure comprising an exemplary embodiment of a control unit 2 according to the disclosure.

Figure 2:
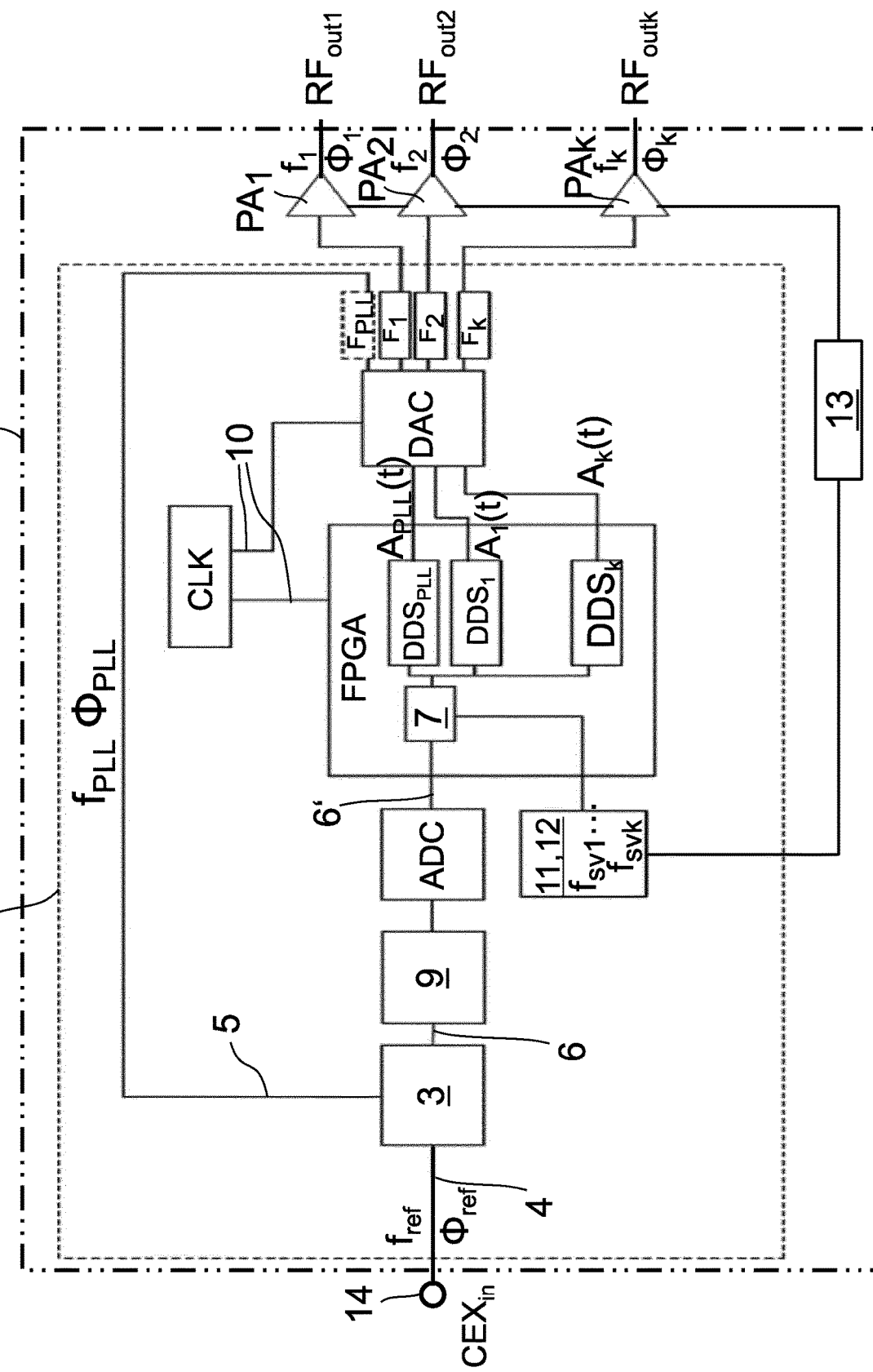

FIG. 2 illustrates a functional diagram of another exemplary embodiment of an RF power generator 20 according to the disclosure comprising another exemplary embodiment of a control unit 21 according to the disclosure.

First, the control unit 2 will be described in more detail hereinafter. Hereby, reference is made to FIGS. 1 and 3 in an alternating fashion, the latter showing i.a. a more detailed functional diagram of the control unit 21 in FIG. 2. However, with regard to the description of the control unit 2 of the RF generator 1 in FIG. 1, references made to FIG. 3 relate only to common components shared by both the control unit 2 and the control unit 21. Essentially, the control unit 2 in FIG. 1 and the control unit 21 in FIGS. 2 and 3, respectively, only differ in the way a reference signal is generated and input to the respective control units 2 and 21, respectively, as will become clearer along with the description of FIG. 2.

In FIG. 1 it is observed that the control unit 2 for generating a plurality (in the present case i=1 to k) of synchronized RF output signals $RF_{out,i}$ each having a respective output frequency $f_i$, phase $\Phi_i$, and amplitude $A_i$, comprises a signal comparator 3, e.g. a phase discriminator (PD), phase-frequency discriminator (PFD), a frequency mixer, or a counter, configured to compare a reference signal 4 having a reference frequency $f_{ref}$ and a reference phase $\Phi_{ref}$ with a feedback signal 5 having a feedback frequency $f_{PLL}$ and a feedback phase $\Phi_{PLL}$. The control unit 2 is configured to generate an error signal 6 representative of a difference between the reference signal 4 and the feedback signal 5. In particular, the signal comparator 3 compares at least one of a phase difference and a frequency difference of the reference signal 4 and the feedback signal 5 so that the error signal 6 is representative of at least one of said phase difference and frequency difference.

Further, the control unit 2 as illustrated in FIG. 1 comprises a data processing unit 7, e.g. a digital data processing unit such as a microprocessor, microcontroller, digital signal processor and the like, receiving as an input signal the error signal 6 generated by the signal comparator 3, and outputting a plurality of waveform tuning signals $FTW_{PLL}$, $FTW_i$ (cf. FIG. 3) as a function of the error signal 6. It is to be noted that the error signal 6 input to the data processing unit 7 may comprise a digital representation 6' of the error signal 6 as will be elucidated in more detail further below. In the presented case, waveform tuning signals $FTW_{PLL}$, $FTW_i$ are formed by digital waveform tuning words, wherein the waveform tuning words each comprise at least one of a frequency information, a phase information, and an amplitude information.

Figure 3:
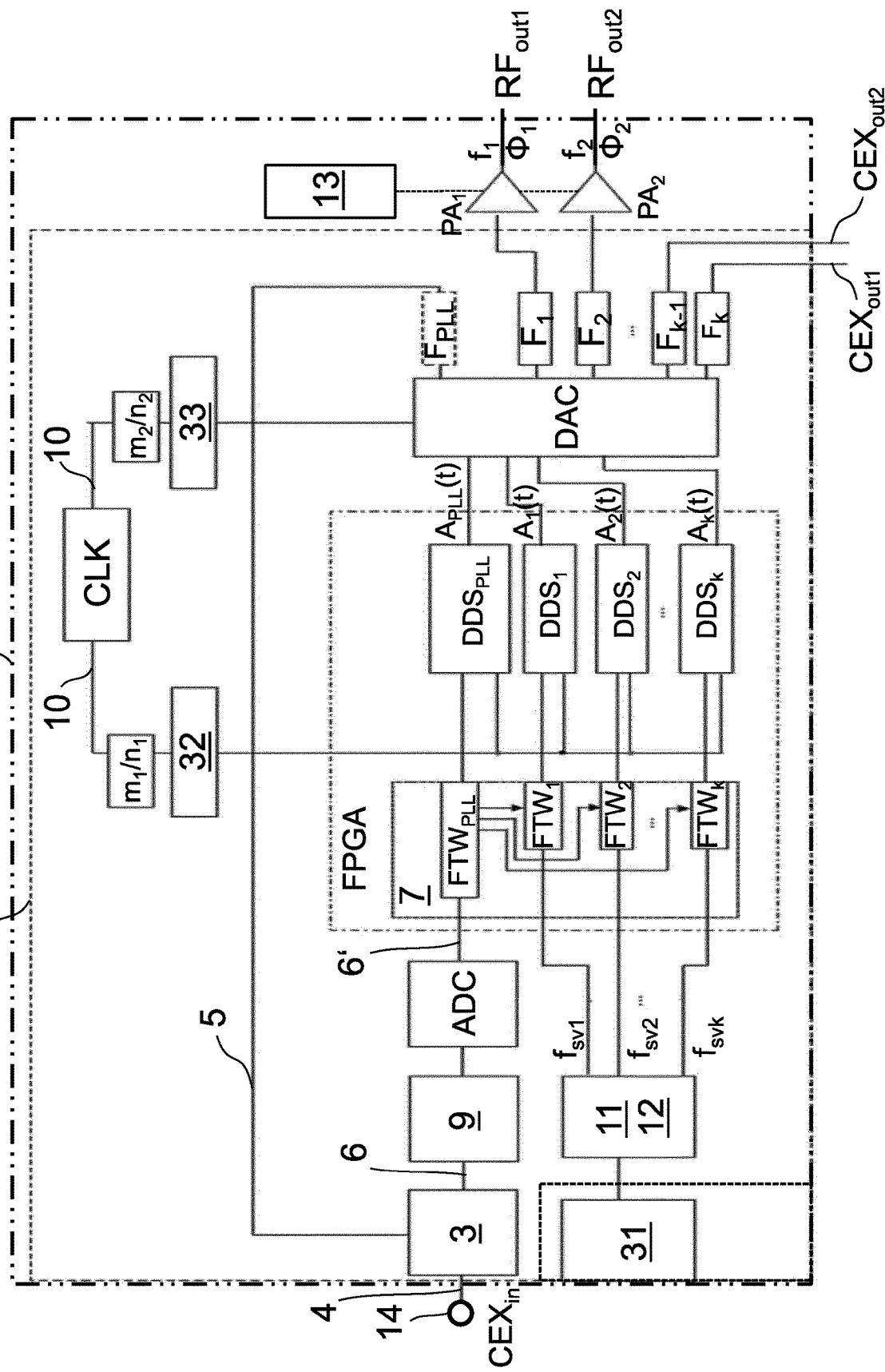

As can be viewed in FIGS. 1 and 3, the control unit 2 further comprises a plurality of waveform generators $DDS_{PLL}$, $DDS_i$ (in the present case each one embodied as a direct digital synthesis cores) each receiving one of the plurality of waveform tuning signals $FTW_{PLL}$, $FTW_i$ output by the data processing unit 7, wherein each waveform generator $DDS_{PLL}$, $DDS_i$ generates a time-dependent amplitude signal $A_{PLL}(t)$, $A_i(t)$ as a function of the received respective waveform tuning signal $FTW_{PLL}$, $FTW_i$. In the control unit 2 of FIG. 1, the time-dependent amplitude signals $A_{PLL}(t)$, $A_i(t)$ are formed as a digital bitstream representing digital amplitude values for each corresponding RF output signal $RF_{out,i}$.

One predetermined amplitude signal, i.e. amplitude signal $A_{PLL}(t)$, of the generated plurality of amplitude signals $A_{PLL}(t)$, $A_i(t)$ represents the feedback signal 5 input to the signal comparator 3, and the other amplitude signals $A_i(t)$ represent the respective RF output signals $RF_{out,i}$ to be generated.

Furthermore, in the control unit 2 of FIG. 1 the data processing unit 7 is configured to adjust both the waveform tuning signal $FTW_{PLL}$ corresponding to the one predetermined amplitude signal $A_{PLL}(t)$ representing the feedback signal 5 such as to minimize the error signal 6, and the other waveform tuning signals $FTW_i$ corresponding to the other amplitude signals $A_i(t)$ representing the RF output signals $RF_{out,i}$ based on the adjusted waveform tuning signal $FTW_{PLL}$ of the predetermined amplitude signal $A_{PLL}(t)$ representing the feedback signal 5.

The control loop formed by the signal comparator 3 receiving the reference signal 4 and the feedback signal 5, and the data processing unit 7 can be considered a PLL control loop, without being limited thereto.

FIG. 1 shows that the control unit 2 further comprises a reference signal source 8, i.e. a signal source internal to the control unit 2, configured to generate the reference signal 4. Preferably, in the example shown in FIG. 1, the internal reference signal source 8 may be a precision crystal oscillator or an oven-controlled crystal oscillator (OCXO), and the like.

Furthermore, FIG. 1 illustrates that the control unit 2 comprises a series connection of a loop filter 9 and an analog-to-digital-converter ADC configured and arranged such as to generate a digital representation 6' of the error signal 6 from the signal comparator 3, and to feed the digital representation of the error signal 6' to the data processing unit 7.

FIG. 1 also shows that in the control unit 2 the data processing unit 7 and the plurality of waveform generators $DDS_{PLL}$, $DDS_i$ are formed by a field programmable gate array FPGA, however, not being limited thereto. A System-on-Chip (SoC), an application-specific integrated circuit (ASIC), and the like are also conceivable for implementing the data processing unit 7 and/or the waveform generators $DDS_{PLL}$, $DDS_i$.

The exemplary control unit 2 depicted in FIG. 1 also comprises at least one digital-to-analog-converter DAC, in the present case a multi-channel DAC, converting the digital amplitude values $A_{PLL}(t)$, $A_i(t)$ contained in the bitstreams generated by the waveform generators $DDS_{PLL}$, $DDS_i$ into the feedback signal 5 and the RF output signals $RF_{out,i}$, respectively.

It is to be noted that, instead of one multi-channel DAC shown in FIG. 1, a plurality of single-channel digital-DACs, a plurality of dual-channel DACs, a plurality of x-channel DACs or any combination thereof may be used.

The control unit 2 in FIG. 1 further comprises a plurality of signal reconstruction filters $F_i$ filtering the respective RF output signals $RF_{out,i}$ after conversion by the digital-to-analog converter DAC.

As indicated in FIG. 1 by means of a dashed rectangular box drawn around a feedback signal reconstruction filter $F_{PLL}$, depending on the specific design of the signal comparator 3, the feedback signal reconstruction filter $F_{PLL}$ filtering the feedback signal 5 after conversion by the digital-to-analog converter DAC may be provided or may be omitted.

According to FIG. 1, the exemplary control unit 2 also comprises a system clock CLK generating a system clock signal 10. The plurality of waveform generators $DDS_{PLL}$, $DDS_i$ and the digital-to-analog converter DAC are driven by the system clock signal 10, wherein a more detailed description of the system clock signal 10 and its specific use by the waveform generators $DDS_{PLL}$, $DDS_i$ and the DAC will be given along with the discussion of FIG. 3 further below.

Still further, according to the embodiment of the control unit 2 shown in FIG. 1, a memory device 11, e.g. RAM, EPROM, Flash, ROM, and the like, storing a plurality of predeterminable waveform set values $f_{sv,i}$ each corresponding to one respective of the waveform tuning signals $FTW_i$ of the RF output signals $RF_{out,i}$ to be generated, wherein the data processing unit 7 is further configured to output the plurality of waveform tuning signals $FTW_i$ as a function of the waveform set values $f_{sv,i}$. As with the waveform tuning signals $FTW_i$, the waveform set values $f_{sv,i}$ may comprise a frequency information, a phase information, and/or an amplitude information with regard to the respective RF output signal to be generated.

Yet further, the control unit 2 presented in FIG. 1 also comprises a control device 12, e.g. a microprocessor, microcontroller, and the like, configured to modify the waveform set values $f_{sv,i}$ stored in the memory device 11 according to a predefined schedule, e.g. a plasma processing method. In the present case, the memory device 11 and the control device 12 are formed as one integrated electronic component/unit, however, without being limited thereto.

As observed in FIG. 1, the control unit 2 is part of the RF power generator 1 for generating the plurality of synchronized RF output signals $RF_{out,i}$ each having a respective output frequency $f_i$, phase $\Phi_i$, and amplitude $A_i$. To this end, the RF power generator 1 comprises a DC power supply 13, and power amplifiers $PA_i$ each receiving power from the DC power supply 13. Each power amplifier $PA_i$ is configured to amplify the respective RF output signal $RF_{out,i}$. The detailed and specific settings of the DC power supply 13 may vary depending on the required gain of the power amplifiers and may be controlled by the control device 12 as required by the waveform set values $f_{sv,i}$. For example, a lookup table and an algorithm to determine the best settings of the output power level of the DC power supply 13 may be used.

As already mentioned further above, the control unit 21 of the RF power generator 20 illustrated in FIG. 2 essentially differs from the control unit 2 shown in FIG. 1 only in that the reference signal 4 is not generated by an internal reference signal source 8 (cf. FIG. 1) but input to the control unit 21 from an external reference signal source 14. This reference signal source 14 being external to the control unit 21 and the RF power generator 20 may be an atomic clock providing an atomic clock reference signal, a high-precision oscillator synchronized with an atomic clock providing a high-precision oscillator signal, a precision crystal oscillator, an oven-controlled crystal oscillator (OCXO), or another RF power generator (not shown in FIG. 2) generating a common exciter CEX signal which is input to a common exciter input $CEX_{in}$.

FIG. 3 illustrates a functional diagram of yet another exemplary embodiment of an RF power generator 30 according to the disclosure comprising a more detailed functional diagram of the control unit 21 in FIG. 2.

As shown in FIG. 3, the RF power generator 30 comprises a common exciter input $CEX_{in}$ connected to the control unit 21 for receiving an external common exciter signal CEX as the reference signal 4.

Furthermore, the exemplary RF power generator 30 further comprises two common exciter outputs $CEX_{out1,2}$ each providing a respective one of the plurality of RF output signals $RF_{out,k-1}$, $RF_{out,k}$ as an external common exciter signal CEX. It is to be noted that in the case according to FIG. 3, the two RF output signals $RF_{out,k-1}$, $RF_{out,k}$ output on the respective CEX output $CEX_{out1,2}$ have not been power-amplified by one of the power amplifiers $PA_i$. Instead, they are output after being filtered by the respective signal reconstruction filters $F_{k-1}$, $F_k$. However, a small preamplification of the CEX output signals on $CEX_{out1,2}$ by an appropriate preamplifier (not shown) may be provided.

As illustrated in FIG. 3, the RF generator 30 also comprises a user interface device 31, e.g. a touch screen, for setting the output frequencies $f_i$, phases $\Phi_i$, and/or amplitudes $A_i$ of the respective RF output signals $RF_{out,i}$ and for monitoring an operational state of the RF power generator 30.

It is to be noted that in the case presented in FIG. 3, the user interface device 31 is part of the RF power generator 30. However, alternatively, it may be a component of the control unit 21 too.

FIG. 3 also illustrates that a waveform generator clock signal 32 (herein also referred to as an FPGA clock signal) for driving the waveform generators $DDS_{PLL}$, $DDS_i$ and a DAC clock signal 33 for driving the digital-to-analog converter DAC are different predetermined rational fractions $m_1/n_1$ and $m_2/n_2$, respectively, of the system clock signal 10. Detailed description of how to determine the respective clock signals 32, 33 is given in the general part of this specification.

Figure 4:
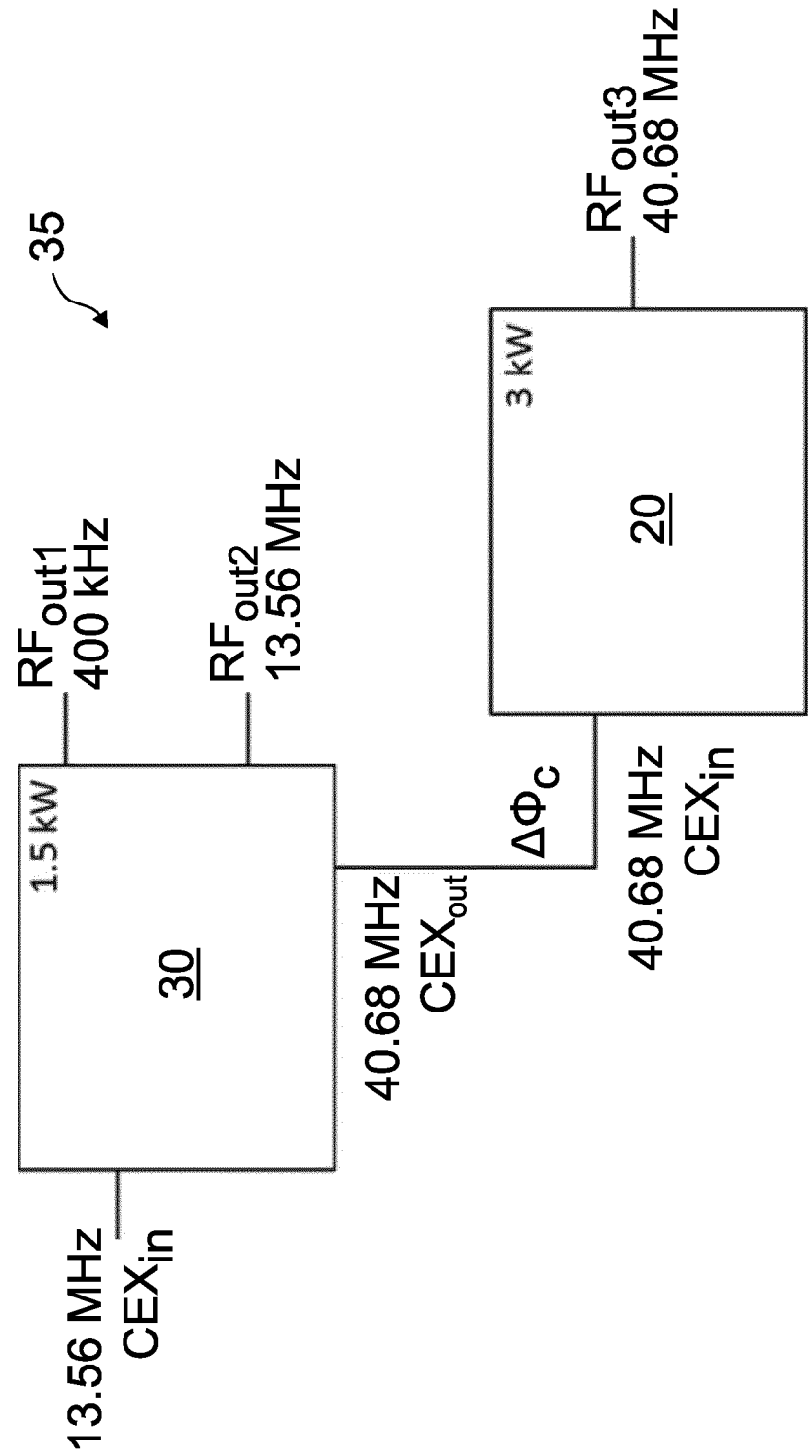

FIG. 4 shows a functional diagram of an exemplary embodiment of an arrangement 35 of two RF power generators, e.g. RF power generators 20 and 30, according to the disclosure. In this exemplary case, RF power generator 30 comprises a common exciter input $CEX_{in}$ and a common exciter output $CEX_{out}$ as well as two RF power output signals $RF_{out1,2}$. RF power generator 20 comprises one common exciter input $CEX_{in}$ and one RF power output signal $RF_{out3}$.

For example, such an arrangement may be used as a dual-frequency plasma power supply, e.g. 13.56 MHz and 60 MHz, or 13.56 MHz and 400 kHz as shown in FIG. 4. Due to the synchronization concept according to the disclosure described herein, the two power output signals $RF_{out1}$ and $RF_{out2}$ of the power generator 30 in FIG. 4 are automatically frequency-locked.

Another application scenario may be the combination of frequency-locked power generators of different brands. Then, power generator 30 in FIG. 4 acts as a master generator providing appropriate CEX signals to synchronize all connected power generators, i.e. generator 20 in FIG. 4 for example.

In particular, any existing conventional power generator which requires a dedicated CEX input signal can be synchronized with such a master power generator as the generator 30 in FIG. 4 for example. Moreover, the synchronized power generators may even be phase-shifted with respect to the master generator, and even cable length-induced phase shifts $\Phi_c$ (as mentioned in the general description part of this specification) may already be compensated on the master generator side.

In FIG. 4, the master generator 30 generates two frequencies (in this case 400 kHz and 13.56 MHz) as its own power output signals $RF_{out1,2}$, and provides a third frequency CEX signal $CEX_{out}$ to generator 20 (also maybe a conventional generator which can only be synced with its specific operating frequency, in this case 40.68 MHz for example).

Figure 5:
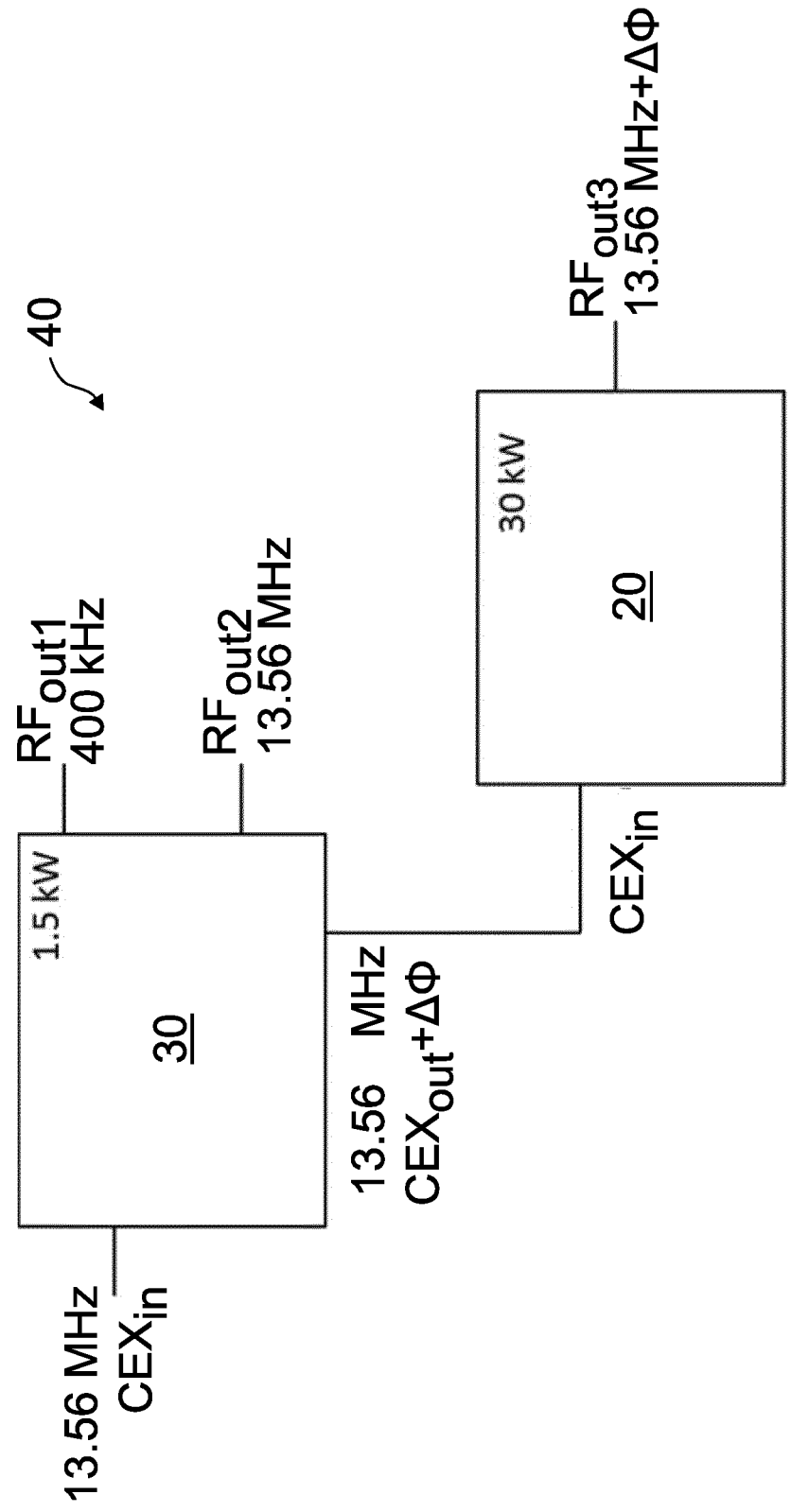

FIG. 5 depicts a functional diagram of another exemplary embodiment of an arrangement 40 of two RF power generators according to the disclosure.

In the illustrated example, two linked RF power generators, e.g. generators 30 and 20, are synchronized to each other, wherein power generator 20 uses a CEX input signal $CEX_{in}$ already phase-shifted by $\Delta\Phi$ in the master generator 30.

Figure 6:
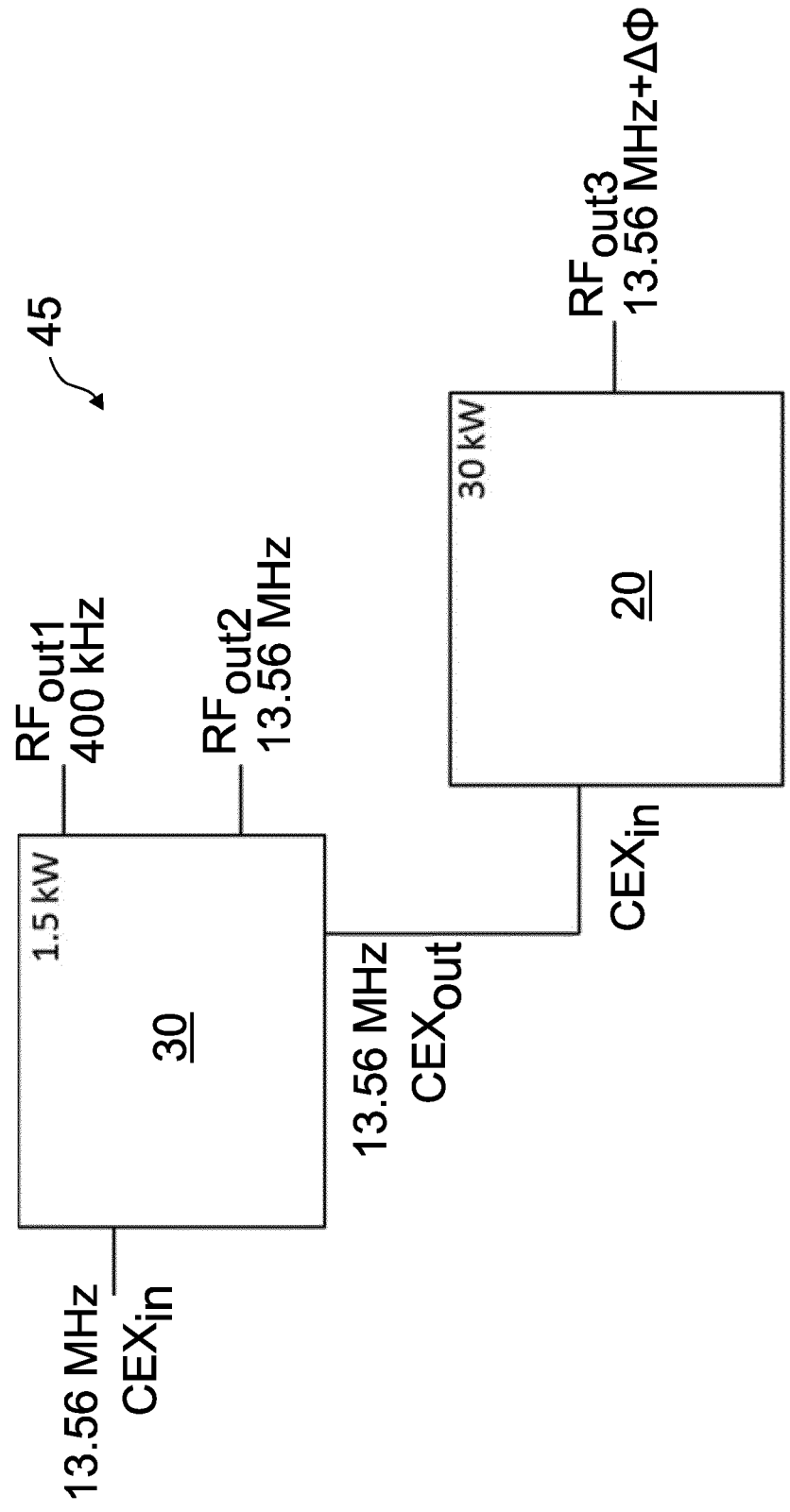

FIG. 6 shows a functional diagram of still another exemplary embodiment of an arrangement 45 of two RF power generators, e.g. power generators 20 and 30, according to the disclosure.

In the illustrated example, power generator 20 of the two linked RF power generators 20 and 30 is synchronized via a $CEX_{out}$ signal from generator 30 and additionally phase-shifted internally by $\Delta\Phi$.

Figure 7:
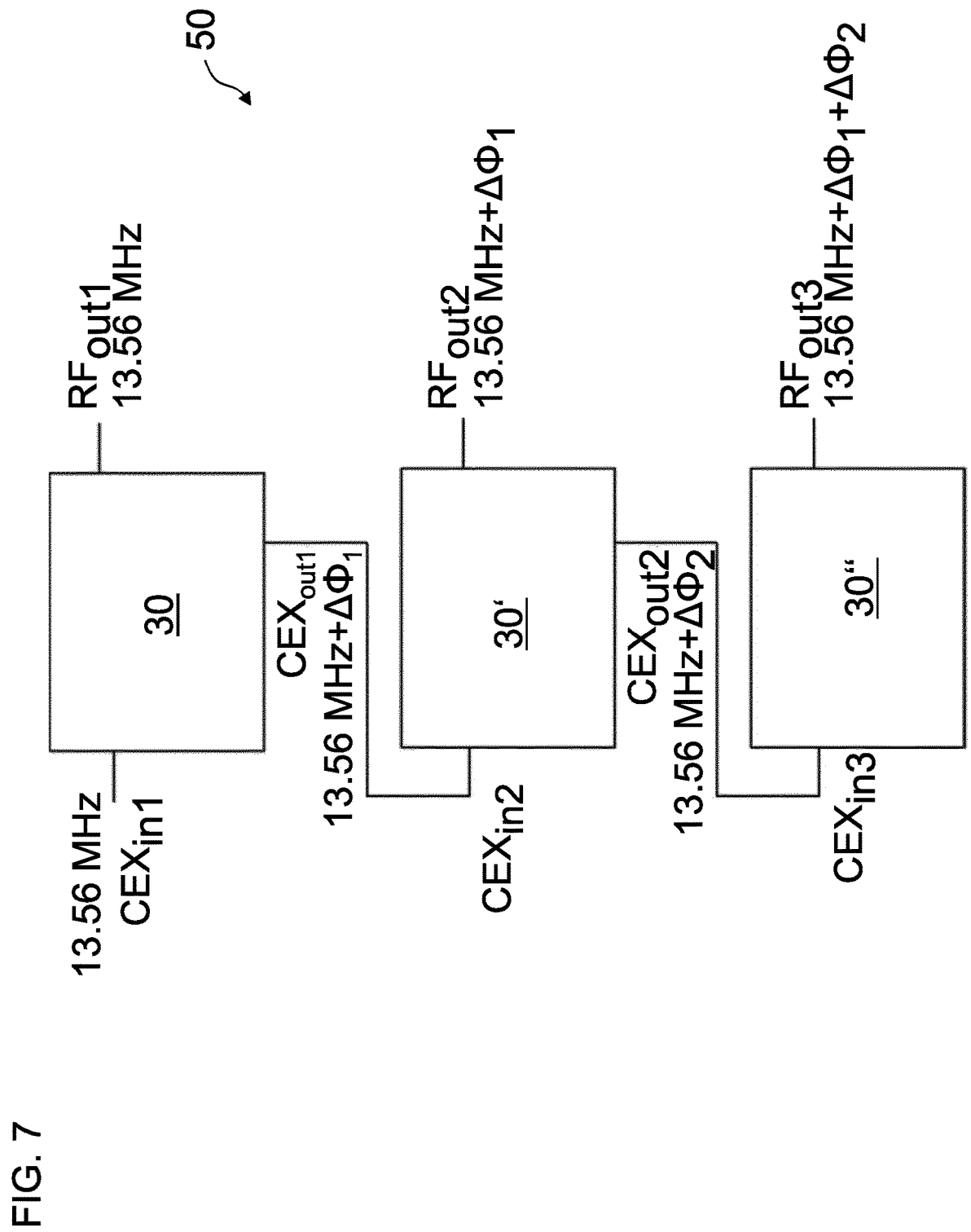

FIG. 7 illustrates a functional diagram of an exemplary embodiment of an arrangement 50 of three RF power generators according to the disclosure.

In the illustrated example, a so-called daisy chain of three phase-locked power generators, e.g. the RF power generators 30, 30', 30", wherein 30' and 30" denote hardware duplicates of the power generator 30, is formed, in which each generator adds an individual phase shift $\Delta\Phi_1$, $\Delta\Phi_2$ via its internal digital waveform generator(s). Cable length-induced phase shifts $\Delta\Phi_c$ as shown in FIG. 4 are not explicitly indicated in FIG. 7, however, they may be compensated as described with FIG. 4 above. The three daisy chain-linked RF power generators 30, 30', 30" generate the same output frequency. Only the $CEX_{out}$ signals for the next generator in the chain are phase-shifted individually by each generator.

Figure 8:
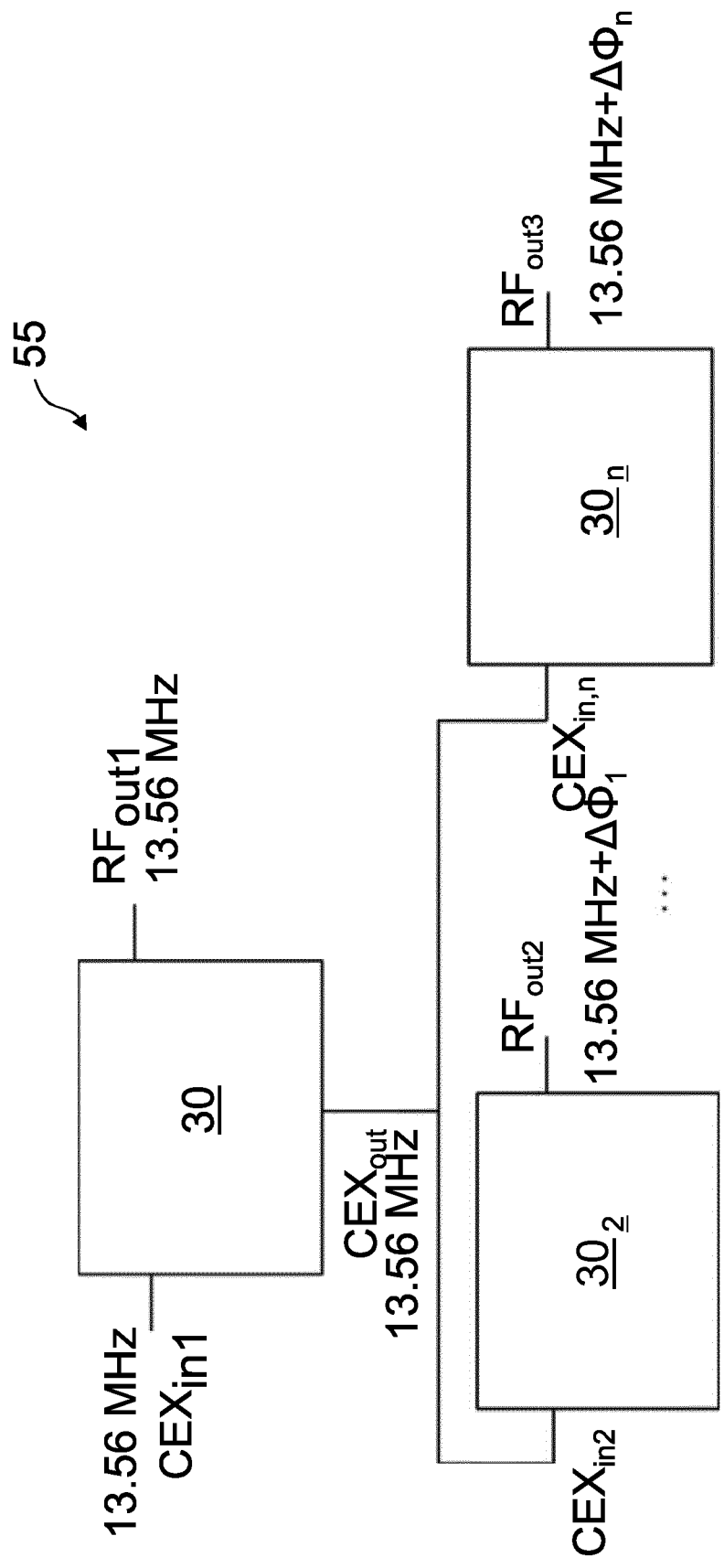

FIG. 8 shows a functional diagram of another exemplary embodiment of an arrangement 55 of several RF power generators 30, $30_2$, ... $30_n$ according to the disclosure, wherein the generators $30_2$ ... $30_n$ are hardware duplicates of the power generator 30.

In the illustrated example, a parallel combination of phase-locked generators $30_2$ ... $30_n$ of the same frequency with different phase-shifts $\Delta\Phi_i$, e.g. in a star-like configuration, with one central master generator 30 is shown. All generators are synchronized via CEX signals from the master generator 30. The required phase-shifts $\Delta\Phi_i$ can either be implemented in the CEX signals on the master generator end or be added by the respective digital waveform generators in the slave generators $30_2$ ... $30_n$.

In FIG. 8, the generators $30_2$ ... $30_n$ share the same $CEX_{out}$ signal from generator 30 without phase-shift $\Delta\Phi$ towards the reference frequency at $CEX_{in1}$ of the master generator 30, and add individual phase-shifts $\Delta\Phi_i$ internally.

It is to be noted, that cable-length induced phase-shifts are explicitly mentioned only in FIG. 4, but omitted in FIGS. 5 to 8 although they are present. In all embodiments, phase-shifts caused by cables may be compensated by using the disclosure, i. e. by adding a compensating phaseshift in the master or slave generator.

Figure 9:
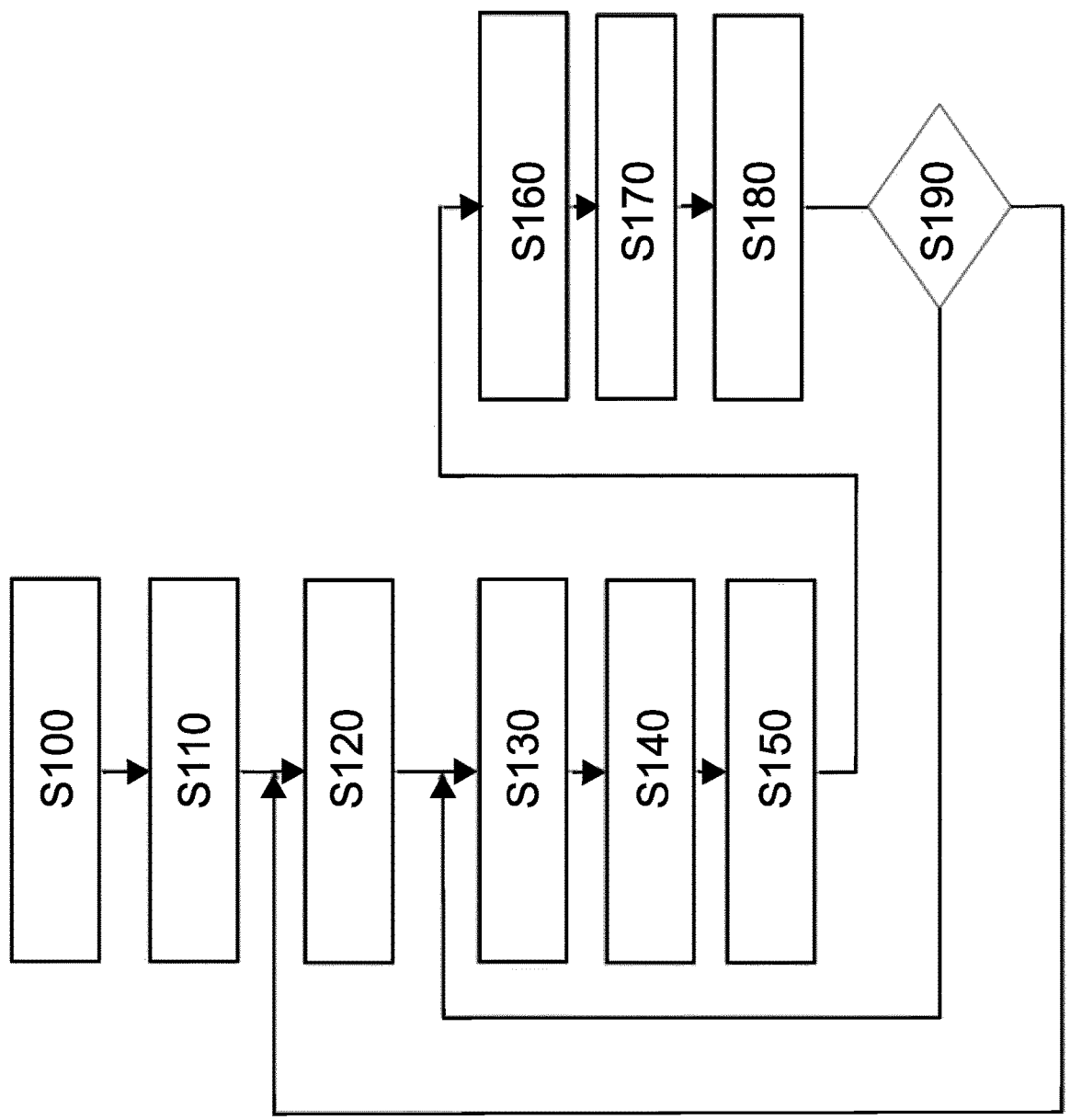

FIG. 9 shows a flow chart of an exemplary embodiment of a method for generating synchronized RF output signals $RF_{out,i}$ each having a respective output frequency $f_i$, phase $\Phi_i$, and amplitude $A_i$, according to the disclosure.

In the inner loop shown in FIG. 9, synchronization of the multiple RF output signals having different frequencies is carried out. The entire process is controlled by a process schedule or recipe with updates of the required RF output signal parameters in regular time intervals TI according to the outer loop shown in FIG. 9.

In particular, in step S100, one of the RF output signals is selected as a control loop feedback signal, e.g. feedback signal 5. In other words, the feedback signal is set to the same frequency as an external or internal precision reference frequency and an appropriate amplitude and phase offset for use as the feedback signal (PLL control signal).

In step S110, a starting or set value for the frequency tuning word $FTW_{PLL}$ of the feedback signal is set, e.g. selected from a lookup table.

In step S120, all other RF output signals are defined by frequency, amplitude, and phase offset. If RF output signals are supposed to vary over time, a suitable time interval for changing RF output signal parameters is determined.

In step S130, for each required frequency, frequency tuning words $FTW_i$ (i=1 ... k) based on the frequency tuning word $FTW_{PLL}$ of the feedback signal is calculated according to formula given hereinabove (cf. general description of the disclosure).

In step S140, the time-dependent amplitude value sequences $A_i(t)$ for each frequency tuning word $FTW_i$ is generated via the respective $DDS_i$ cores.

In step S150, the amplitude sequences $A_{PLL}(t)$, $A_i(t)$ for each frequency are converted into analog signals by the multi-channel DAC.

In Step 160, the output signals are filtered by respective signal reconstruction filters $F_i$ (optionally also $F_{PLL}$) to produce sinusoidal output waveforms with frequencies $f_{PLL}$ and $f_i$.

In Step 170, the feedback signal $f_{PLL}$ is compared to the reference signal $f_{ref}$ and the error signal 6 is produced.

In step 180, a digitized representation 6' of the error signal 6 is used to calculate an optimized frequency tuning word $FTW_{PLL}$.

In step 190, it is checked if the predetermined time interval TI has expired. If it is not expired, the method returns to step S130 (inner loop).

Otherwise, any changes to the RF output signal parameters are carried out as required by the desired signal modulation of a plasma process, for example. Thereafter, the method continues with step S120 (outer loop).

While the disclosure has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure, and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

REFERENCE NUMERALS

1 RF power generator
2 control unit
3 signal comparator
4 reference signal
5 feedback signal
6 error signal
6' digital representation of 6
7 data processing unit
8 internal reference signal source
9 loop filter
10 system clock signal
11 memory device
12 control device
13 DC power supply
14 external reference signal source
20 RF power generator
21 control unit
30 RF power generator
31 user interface device
32 waveform generator clock signal/FPGA clock signal
33 DAC clock signal
35 RF power generator arrangement
40 RF power generator arrangement
45 RF power generator arrangement
50 RF power generator arrangement
55 RF power generator arrangement
A amplitude
A(t) time-dependent amplitude signal
$A_{PLL}(t)$ time-dependent amplitude signal of feedback signal
ADC analog-to-digital-converter
CEX common exciter
$CEX_{in}$ common exciter input
$CEX_{out}$ common exciter output
CLK system clock
DAC digital-to-analog-converter
DDS direct digital synthesis core
$DDS_{PLL}$ direct digital synthesis core for feedback signal
f frequency
$f_{PLL}$ frequency of feedback signal
$f_{ref}$ frequency of reference signal
$f_{sv}$ frequency set value
F signal reconstruction filter
FPGA field programmable gate array
FTW frequency tuning word
$FTW_{PLL}$ frequency tuning word of feedback signal
Φ phase
$Φ_{PLL}$ phase of feedback signal
$Φ_{ref}$ phase of reference signal
ΔΦ phase shift
$ΔΦ_c$ cable length-induced phase shift
PA power amplifier
PLL phase-locked loop
RF radio frequency
$RF_{out}$ radio frequency output signal

The invention claimed is:

1. A control unit for generating a plurality of synchronized radio frequency (RF) output signals ($RF_{out,i}$) each having a respective output frequency ($f_i$), phase ($Φ_i$), and amplitude ($A_i$), comprising:
   a signal comparator configured to compare a reference signal having a reference frequency ($f_{ref}$) and a reference phase ($Φ_{ref}$) with a feedback signal having a feedback frequency ($f_{PLL}$) and a feedback phase ($Φ_{PLL}$), and configured to generate an error signal representative of a difference between the reference signal and the feedback signal; and
   a data processing unit receiving as an input signal the error signal generated by the signal comparator, and outputting a plurality of waveform tuning signals ($FTW_{PLL}$, $FTW_i$) as a function of the error signal;
   wherein a plurality of waveform generators ($DDS_{PLL}$, $DDS_i$) each receiving at least one of the plurality of waveform tuning signals ($FTW_{PLL}$, $FTW_i$) output by the data processing unit, wherein each waveform generator ($DDS_{PLL}$, $DDS_i$) generates a time-dependent amplitude signal ($A_{PLL}(t)$, $A_i(t)$) as a function of the received respective waveform tuning signal ($FTW_{PLL}$, $FTW_i$);
   wherein one predetermined amplitude signal ($A_{PLL}(t)$) of the generated plurality of amplitude signals ($A_{PLL}(t)$, $A_i(t)$) represents the feedback signal input to the signal comparator, and the other amplitude signals ($A_i(t)$) represent the respective radio frequency (RF) output signals ($RF_{out,i}$) to be generated, and
   wherein the data processing unit is configured to adjust both the waveform tuning signal ($FTW_{PLL}$) corresponding to the one predetermined amplitude signal ($A_{PLL}(t)$) representing the feedback signal such as to minimize the error signal, and the other waveform tuning signals ($FTW_i$) corresponding to the other amplitude signals ($A_i(t)$) representing the radio frequency (RF) output signals ($RF_{out,i}$) based on the adjusted waveform tuning signal ($FTW_{PLL}$) of the predetermined amplitude signal ($A_{PLL}(t)$) representing the feedback signal.

2. The control unit as claimed in claim 1, wherein the signal comparator is configured to compare at least one of a phase difference and a frequency difference of the reference signal and the feedback signal, wherein the error signal is representative of at least one of said phase difference and frequency difference.

3. The control unit as claimed in claim 1, wherein the signal comparator is at least one of a phase discriminator (PD), phase-frequency discriminator (PFD), a frequency mixer, and a counter.

4. The control unit as claimed in claim 1, wherein the reference signal comprises one of a precision crystal oscillator signal, an oven-controlled crystal oscillator (OCXO) signal, an atomic clock signal, a high-precision oscillator signal synchronized with an atomic clock, and a common exciter (CEX) signal generated by an RF generator.

5. The control unit as claimed in claim 1, further comprising a reference signal source configured to generate the reference signal.

6. The control unit as claimed in claim 1, further comprising a series connection of a loop filter and an analog-to-digital-converter (ADC) configured and arranged such as to generate a digital representation of the error signal from the signal comparator, and to feed the digital representation of the error signal to the data processing unit, wherein the data processing unit is a digital data processing unit outputting a plurality of digital waveform tuning words ($FTW_{PLL}$, $FTW_i$) as the waveform tuning signals as input for the plurality of waveform generators ($DDS_{PLL}$, $DDS_i$).

7. The control unit as claimed in claim 6, wherein the waveform tuning word ($FTW_{PLL}$, $FTW_i$) comprises at least one of a frequency information, a phase information, and an amplitude information for generating the time-dependent amplitude signal ($A_{PLL}(t)$, $A_i(t)$).

8. The control unit as claimed in claim 6, wherein each of the waveform generators ($DDS_{PLL}$, $DDS_i$) comprises a direct digital synthesis (DDS) core generating a bitstream representative of digital amplitude values constituting the respective time-dependent amplitude signal ($A_{PLL}(t)$, $A_i(t)$).

9. The control unit as claimed in claim 8, further comprising at least one digital-to-analog-converter (DAC) converting the digital amplitude values ($A_{PLL}(t)$, $A_i(t)$) contained in the bitstreams generated by the waveform generators ($DDS_{PLL}$, $DDS_i$) into the feedback signal and the radio frequency (RF) output signals ($RF_{out,i}$), respectively.

10. The control unit as claimed in claim 9, wherein the digital-to-analog-converter (DAC) is one of a multi-channel digital-to-analog-converter, a plurality of single-channel digital-to-analog-converters, a plurality of dual-channel digital-to-analog-converters or a combination thereof.

11. The control unit as claimed in claim 9, further comprising at least one signal reconstruction filter ($F_i$) filtering at least one of the radio frequency (RF) output signals ($RF_{out,i}$) after conversion by the digital-to-analog converter (DAC).

12. The control unit as claimed in claim 9, further comprising a feedback signal reconstruction filter ($F_{PLL}$) filtering the feedback signal after conversion by the digital-to-analog converter (DAC).

13. The control unit as claimed in claim 9, further comprising a system clock (CLK) generating a system clock signal, wherein the plurality of waveform generators ($DDS_{PLL}$, $DDS_i$) and the digital-to-analog converter (DAC) are driven by the system clock signal.

14. The control unit as claimed in claim 13, wherein a waveform generator clock signal for driving the waveform generators ($DDS_{PLL}$, $DDS_i$) and a DAC clock signal for driving the digital-to-analog converter (DAC) are different predetermined rational fractions ($m_1/n_1$, $m_2/n_2$) of the system clock signal.

15. The control unit as claimed in claim 1, further comprising a memory device storing a plurality of predeterminable waveform set values ($f_{sv,i}$) each corresponding to one respective of the waveform tuning signals ($FTW_i$) of the radio frequency (RF) output signals ($RF_{out,i}$) to be generated, wherein the data processing unit is further configured to output the plurality of waveform tuning signals ($FTW_i$) as a function of the waveform set values ($f_{sv,i}$).

16. The control unit as claimed in claim 15, further comprising a control device configured to modify the waveform set values ($f_{sv,i}$) stored in the memory device according to a predefined schedule.

17. The control unit as claimed in claim 1, wherein at least one of the data processing unit and the plurality of waveform generators ($DDS_{PLL}$, $DDS_i$) is/are formed by at least one of a field programmable gate array (FPGA), a System-on-Chip (SoC), and an application-specific integrated circuit (ASIC).

18. A radio frequency (RF) power generator for generating a plurality of synchronized radio frequency (RF) output signals ($RF_{out,i}$) each having a respective output frequency ($f_i$), phase ($\Phi_i$), and amplitude ($A_i$), comprising:
a DC power supply;
at least one power amplifier ($PA_i$) receiving power from the DC power supply, and configured to amplify at least one of the plurality of radio frequency (RF) output signals ($RF_{out,i}$); and
a control unit for generating the plurality of radio frequency (RF) output signals ($RF_{out,i}$), the control unit comprising:
a signal comparator configured to compare a reference signal having a reference frequency ($f_{ref}$) and a reference phase ($\Phi_{ref}$) with a feedback signal having a feedback frequency ($f_{PLL}$) and a feedback phase ($\Phi_{PLL}$), and configured to generate an error signal representative of a difference between the reference signal and the feedback signal; and
a data processing unit receiving as an input signal the error signal generated by the signal comparator, and outputting a plurality of waveform tuning signals ($FTW_{PLL}$, $FTW_i$) as a function of the error signal;
wherein a plurality of waveform generators ($DDS_{PLL}$, $DDS_i$) each receiving at least one of the plurality of waveform tuning signals ($FTW_{PLL}$, $FTW_i$) output by the data processing unit, wherein each waveform generator ($DDS_{PLL}$, $DDS_i$) generates a time-dependent amplitude signal ($A_{PLL}(t)$, $A_i(t)$) as a function of the received respective waveform tuning signal ($FTW_{PLL}$, $FTW_i$);
wherein one predetermined amplitude signal ($A_{PLL}(t)$) of the generated plurality of amplitude signals ($A_{PLL}(t)$, $A_i(t)$) represents the feedback signal input to the signal comparator, and the other amplitude signals ($A_i(t)$) represent the respective radio frequency (RF) output signals ($RF_{out,i}$) to be generated, wherein the data processing unit is configured to adjust both the waveform tuning signal ($FTW_{PLL}$) corresponding to the one predetermined amplitude signal ($A_{PLL}(t)$) representing the feedback signal such as to minimize the error signal, and the other waveform tuning signals ($FTW_i$) corresponding to the other amplitude signals ($A_i(t)$) representing the radio frequency (RF) output signals ($RF_{out,i}$) based on the adjusted waveform tuning signal ($FTW_{PLL}$) of the predetermined amplitude signal ($A_{PLL}(t)$) representing the feedback signal, and
wherein at least one of the data processing unit and the plurality of waveform generators ($DDS_{PLL}$, $DDS_i$) is/are formed by at least one of a field programmable gate array (FPGA), a System-on-Chip (SoC), and an application-specific integrated circuit (ASIC).

19. The RF power generator as claimed in claim 18, further comprising a common exciter input ($CEX_{in}$) connected to the control unit for receiving an external common exciter signal (CEX) as the reference signal.

20. The RF power generator as claimed in claim 18, further comprising at least one common exciter output ($CEX_{out}$) providing a respective one of the plurality of radio frequency (RF) output signals ($RF_{out,i}$) as an external common exciter signal (CEX).

21. The RF power generator as claimed in claim 18, further comprising a user interface device for at least one of setting the output frequencies ($f_i$), phases ($\Phi_i$), and amplitudes ($A_i$) of the radio frequency (RF) output signals ($RF_{out,i}$) and monitoring an operational state of the power generator.

22. An arrangement of at least two radio frequency (RF) power generators each for generating the plurality of synchronized radio frequency (RF) output signals ($RF_{out,i}$) each having a respective output frequency ($f_i$), phase ($\Phi_i$), and amplitude ($A_i$), and each comprising:
- a DC power supply;
- at least one power amplifier ($PA_i$) receiving power from the DC power supply, and configured to amplify at least one of the plurality of radio frequency (RF) output signals ($RF_{out,i}$); and
- the control for generating the plurality of radio frequency (RF) output signals ($RF_{out,i}$), wherein the control unit is configured as claimed in claim 17,
- wherein one of the power generators further comprises at least one common exciter output ($CEX_{out}$) providing a respective one of the plurality of radio frequency (RF) output signals ($RF_{out,i}$) as an external common exciter signal (CEX), and at least one other of the power generators further comprises a common exciter input ($CEX_{in}$) connected to the control unit for receiving an external common exciter signal (CEX) as the reference signal; and
- wherein the power generators are interconnected such that the common exciter output ($CEX_{out}$) of the one of the power generators is connected to the common exciter input ($CEX_{in}$) of the at least one other of the power generators.

23. A method for generating a plurality of synchronized radio frequency (RF) output signals ($RF_{out,i}$) each having a respective output frequency ($f_i$), phase ($\Phi_i$), and amplitude ($A_i$), comprising the steps of:
- (i) comparing a reference signal having a reference frequency ($f_{ref}$) and a reference phase ($\Phi_{ref}$) with a feedback signal having a feedback frequency ($f_{PLL}$) and a feedback phase ($\Phi_{PLL}$);
- (ii) generating an error signal representative of a difference between the reference signal and the feedback signal;
- (iii) generating a plurality of waveform tuning signals ($FTW_{PLL}$, $FTW_i$) as a function of the error signal;
- (iv) generating a plurality of time-dependent amplitude signals ($A_{PLL}(t)$, $A_i(t)$) each one as a function of a respective one of the plurality of waveform tuning signals ($FTW_{PLL}$, $FTW_i$);
- (v) selecting one predetermined amplitude signal ($A_{PLL}(t)$) of the generated plurality of amplitude signals ($A_{PLL}(t)$, $A_i(t)$) as a representation of the feedback signal in step (i); and
- (vi) outputting the other amplitude signals ($A_i(t)$) as the respective radio frequency (RF) output signals ($RF_{out,i}$) to be generated,
- wherein in step (iii) the one waveform tuning signal ($FTW_{PLL}$) corresponding to the one predetermined amplitude signal ($A_{PLL}(t)$) representing the feedback signal is adjusted such as to minimize the error signal in step (ii), and the other waveform tuning signals ($FTW_i$) corresponding to the other amplitude signals ($A_i(t)$) representing the radio frequency (RF) output signals ($RF_{out,i}$) are adjusted based on the adjusted waveform tuning signal ($FTW_{PLL}$) of the predetermined amplitude signal ($A_{PLL}(t)$) representing the feedback signal.

24. The method as claimed in claim 23, further comprising the steps of:
- (vii) setting at least one of a frequency ($f_i$), phase ($\Phi_i$), and amplitude ($A_i$) as predeterminable signal parameters for at least one of the plurality of radio frequency (RF) output signals ($RF_{out,i}$);
- (viii) repeating steps (i) to (vi) for a predetermined time interval (TI); and
- repeating steps (vii) and (viii) a predefined number of times.

\* \* \* \* \*